United States Patent
Williams et al.

(10) Patent No.: US 7,670,920 B2
(45) Date of Patent: Mar. 2, 2010

(54) METHODS AND APPARATUS FOR FORMING A POLYSILICON CAPACITOR

(75) Inventors: Byron Lovell Williams, Plano, TX (US); Maxwell Walthour Lippitt, III, Rockwall, TX (US); C. Matthew Thompson, Highland Village, TX (US)

(73) Assignee: Texas Instruments Incorporated, Dallas, TX (US)

( * ) Notice: Subject to any disclaimer, the term of this patent is extended or adjusted under 35 U.S.C. 154(b) by 371 days.

(21) Appl. No.: 11/697,962

(22) Filed: Apr. 9, 2007

(65) Prior Publication Data

US 2008/0246070 A1    Oct. 9, 2008

(51) Int. Cl.
*H01L 27/108* (2006.01)
*H01L 29/94* (2006.01)

(52) U.S. Cl. .................. 438/396; 257/296; 257/E21.09; 257/E29.345

(58) Field of Classification Search .................. 438/210, 438/396, 253, 204, 453, 189, 195, 207, 202, 438/254, 255, 256, 397, 398, 270, 271, 587, 438/589, 593; 257/E21.008, E27.016, E21.09, 257/E29.345, 345, 310, 296
See application file for complete search history.

(56) References Cited

U.S. PATENT DOCUMENTS

| | | | |
|---|---|---|---|
| 4,191,603 A * | 3/1980 | Garbarino et al. | 438/588 |
| 5,037,772 A | 8/1991 | McDonald | |
| 5,393,691 A | 2/1995 | Hsu et al. | |
| 5,554,558 A | 9/1996 | Hsu et al. | |
| 6,507,063 B2 | 1/2003 | Coolbaugh et al. | |

OTHER PUBLICATIONS

Janet M. Towner and John J. Jaughton, "Dopant Influence on Polysilicon Capacitor Oxide Failure" 2004 IRW Final Report, 0-7803-8517-9/04 IEEE, pp. 145-147.

* cited by examiner

*Primary Examiner*—Walter L Lindsay, Jr.
(74) *Attorney, Agent, or Firm*—Jacqueline J. Garner; Wade J. Brady, III; Frederick J. Telecky, Jr.

(57) ABSTRACT

An embodiment relates generally to a method of forming a capacitor. The method includes depositing a first layer of polysilicon on a substrate and implanting a high dose of implant into the first layer of polysilicon. The method also includes depositing a layer of dielectric over the first layer of polysilicon and depositing a second layer of polysilicon over the layer of dielectric. The method further includes implanting an equivalent concentration of implant in both the first layer of polysilicon into the second layer of polysilicon.

20 Claims, 3 Drawing Sheets

METHODS AND APPARATUS FOR FORMING A POLYSILICON CAPACITOR

FIELD

This invention relates generally to polysilicon capacitors, more particularly to methods and apparatus for forming a polysilicon capacitor with a low voltage capacitance coefficient.

DESCRIPTION OF THE RELATED ART

Polysilicon-to-polysilicon capacitors ("polysilicon capacitors") are a generally well known device. U.S. Pat. No. 5,037,772, commonly assigned and hereby incorporated by reference in its entirety, describes a method for forming a polysilicon capacitor.

Polysilicon capacitors are useful in circuit design and manufacture. The use of polysilicon capacitors can be often desirable as a front end process because of the higher quality materials that are used and obviate a need for a second mask as with conventional back-end processes.

However, polysilicon capacitors can become problematic in linear circuits. Linear circuit applications require capacitors to have a flat and low voltage capacitance coefficient ("VCC") over a voltage range. Current polysilicon capacitors can not match the performance characteristics of metal capacitors or polysilicon-to-metal capacitors. One limitation to the performance of polysilicon capacitors is that conventional polysilicon capacitors show greater dispersion over the voltage range because of depletion of the electrodes. In contrast, metal capacitors dispersion is a result of nitride defects. Accordingly, what is needed in the art is a polysilicon-to-polysilicon capacitor with comparable or better performance characteristics than metal capacitors for linear operations.

SUMMARY

An embodiment relates generally to a method of forming a capacitor. The method includes depositing a first layer of polysilicon on a substrate and implanting a high dose of implant into the first layer of polysilicon. The method also includes depositing a layer of dielectric over the first layer of polysilicon and depositing a second layer of polysilicon over the layer of dielectric. The method further includes implanting an equivalent concentration of implant species into the first and second layer of polysilicon.

Another embodiment pertains generally to a capacitor. The capacitor includes a first layer of polysilicon deposited over a substrate and a dielectric layer deposited over the first layer of polysilicon. The capacitor also includes a second layer of polysilicon deposited over the dielectric layer, where the first layer of polysilicon and the second layer of polysilicon are implanted with dopant in substantially equivalent concentrations.

Yet another embodiment relates generally to a method for forming an integrated circuit in and on a silicon substrate with a polysilicon capacitor. The method includes depositing a first layer of polysilicon on a substrate and implanting a high dose of implant into the first layer of polysilicon. The method also includes depositing a layer of dielectric over the first layer of polysilicon and depositing a second layer of polysilicon over the layer of dielectric. The method further includes implanting an equivalent concentration of implant as the first layer of polysilicon into the second layer of polysilicon.

BRIEF DESCRIPTION OF THE DRAWINGS

Various features of the embodiments can be more fully appreciated, as the same become better understood with reference to the following detailed description of the embodiments when considered in connection with the accompanying figures, in which.

DETAILED DESCRIPTION OF EMBODIMENTS

For simplicity and illustrative purposes, the principles of the present invention are described by referring mainly to exemplary embodiments thereof. However, one of ordinary skill in the art would readily recognize that the same principles are equally applicable to, and can be implemented in, all types of semiconductor processing, and that any such variations do not depart from the true spirit and scope of the present invention. Moreover, in the following detailed description, references are made to the accompanying figures, which illustrate specific embodiments. Electrical, mechanical, logical and structural chances may be made to the embodiments without departing from the spirit and scope of the present invention. The following detailed description is, therefore, not to be taken in a limiting sense and the scope of the present invention is defined by the appended claims and their equivalents.

Embodiments relate generally to methods and apparatus for a minimum voltage-capacitance coefficient polysilicon-to-polysilicon ("polysilicon") capacitor with performance characteristics comparable to or better than metal capacitors. More particularly, a first layer of polysilicon is deposited on a substrate such as silicon. The first layer of polysilicon is implanted with a high concentration of dopants such as 7.5× $10^{15}$ cm$^{-2}$ or higher as compared to normal polysilicon applications. A dielectric layer such as SiN is then deposited over the first layer of doped polysilicon using LPCVD techniques. A second layer of polysilicon can be subsequently deposited over the dielectric layer. The second layer of polysilicon is doped with an equivalent concentration of dopants as the first layer of polysilicon. The high implant dosing and equivalent doping of the first and second layers of polysilicon provide a voltage capacitance coefficient (VCC) over a selected voltage range comparable to or better than metal capacitors due to the low dispersion of the electrodes. Accordingly, the low VCC allows for integration of the equivalently doped polysilicon capacitors into linear applications.

FIGS. 1A-E collectively illustrate a process 100 for forming an embodiment of the low VCC polysilicon capacitor. It should be readily apparent to those of ordinary skill in the art that the process 100 depicted in FIG. 1 represents a generalized schematic illustration and that other steps may be added or existing steps may be removed or modified.

Figure 1A:
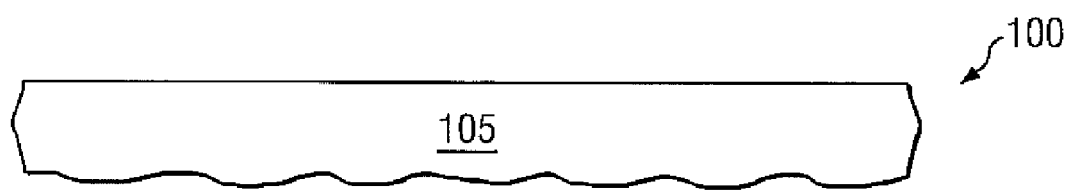
FIGS. 1A-1E collectively depict a process for forming an embodiment of the present teachings.

As shown in FIG. 1A, process 100 may begin with a substrate 105. The substrate 105 can be a silicon based material such as silicon dioxide ("SiO$_2$") to form a low VCC polysilicon capacitor. The substrate 105 may be prepared for formation of semiconductor devices in accordance with semiconductor processes such as CMOS, BICMOS, MOSFET or other semiconductor technologies as known to those skilled in the art.

Figure 1B:
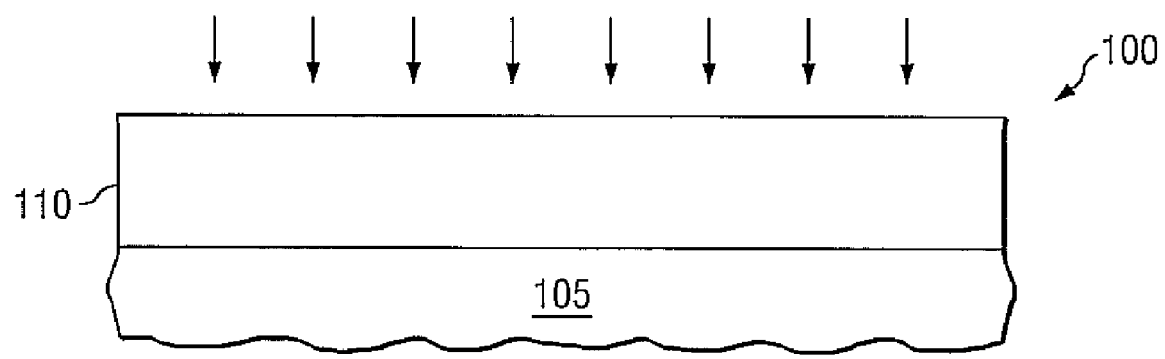

Referring to FIG. 1B, a first layer of polysilicon 110 can be deposited on the substrate 105. The polysilicon 110 can be a material comprising multiple small silicon crystals deposited on a substrate using chemical vapor deposition techniques as known to those skilled in the art. In some embodiments, the polysilicon 110 can also be implemented with amorphous silicon. The polysilicon 110 layer can be deposited to a predetermined thickness. In some embodiments, the thickness can range from about 2000 to 2700 Angstroms.

After the deposition process, the polysilicon can be implanted with implants species such as n-type dopants such as phosphorus, arsenic, etc or p-type dopants such as boron, gallium, etc. For various embodiments, the dopant concentration for the first layer of polysilicon 110 can range from about $6.1\times10^{15}$ cm$^{-2}$ to about $1.2\times10^{16}$ cm$^{-2}$, at an energy level between 30 and 45 keV. In other embodiments, the dopant concentration can be above or below the above-mentioned range depending on the performance requirements of the selected polysilicon capacitor. Similarly, the thickness of the first layer of polysilicon can be dependent on the application of the eventual formed polysilicon capacitor. In one embodiment, the thickness of the first layer of polysilicon is about 2000 Angstroms.

Figure 1C:
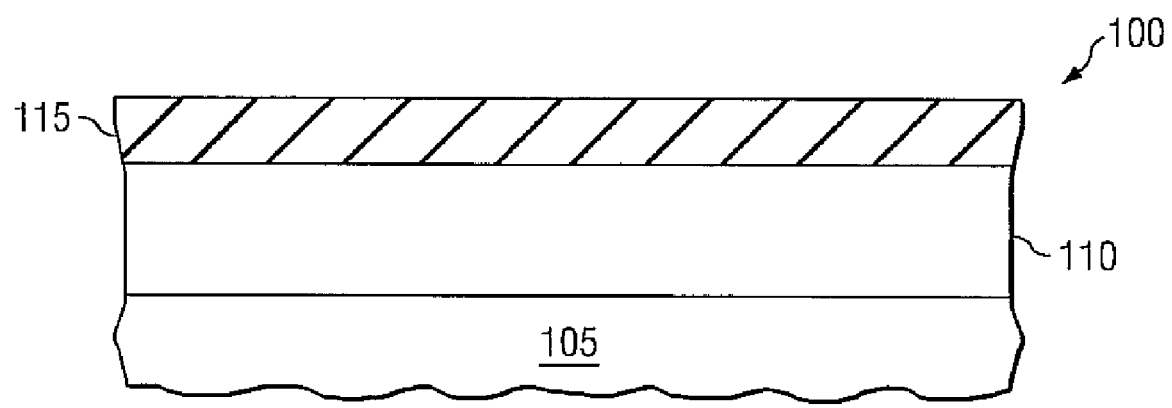

Referring to FIG. 1C, a dielectric layer 115 can be deposited over the first layer of polysilicon 110. The dielectric layer 115 can be a material that is highly resistant to electric current such as silicon nitride ("SiN"), $SiO_2$, $Al_2O_3$, $Ta_2O_5$, $HfO_2$, HfSiON, etc. In some embodiments, the thickness of the dielectric layer 115 can be about 350 angstroms. It should be readily obvious to one skilled in the art that the thickness of the dielectric layer 115 is dependent on the desired performance characteristics of the eventual formed polysilicon capacitor.

Figure 1D:
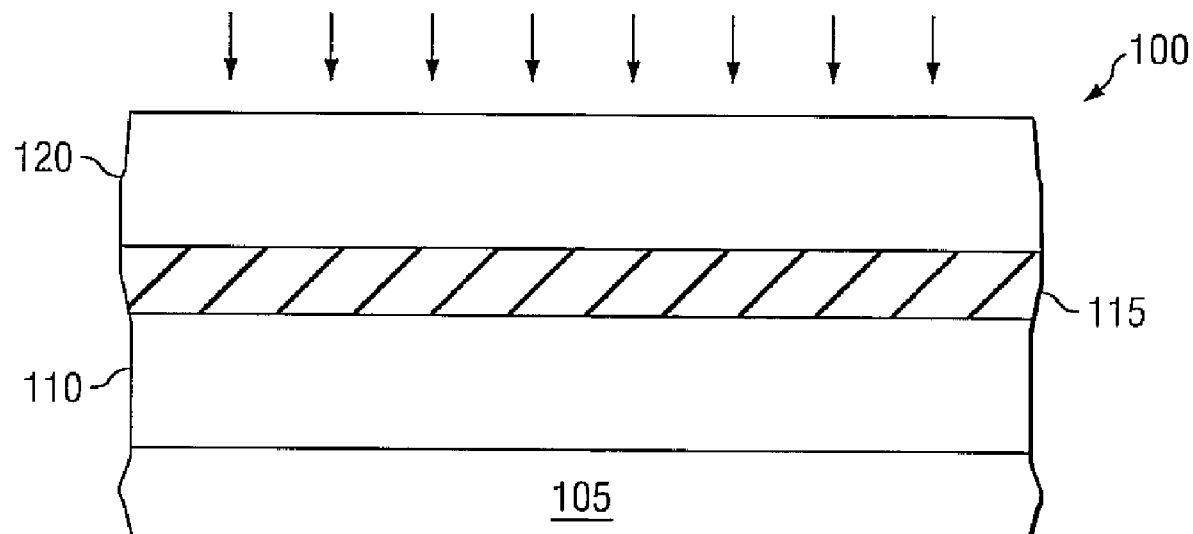

With reference to FIG. 1D, a second layer of polysilicon 120 can be deposited over the dielectric layer 115. The second layer of polysilicon 120 can be deposited using LPCVD techniques at a temperature of 620 Celsius (C) for polysilicon or 530° C. for amorphous silicon to a thickness of about 2000 Angstroms in some embodiments Subsequently, the second layer of polysilicon 120 can be implanted with an implant species such as a n-type dopant at a concentration between $3.0\times10^{15}$ atm/cm$^2$ and $6\times10^{15}$ atm/cm$^2$ at an energy level between 30 and 45 keV in some embodiments. As with the first layer of polysilicon 110, the dopant concentration and thickness of the second layer of polysilicon are related to desired characteristics of the eventual formed capacitor.

Figure 1E:
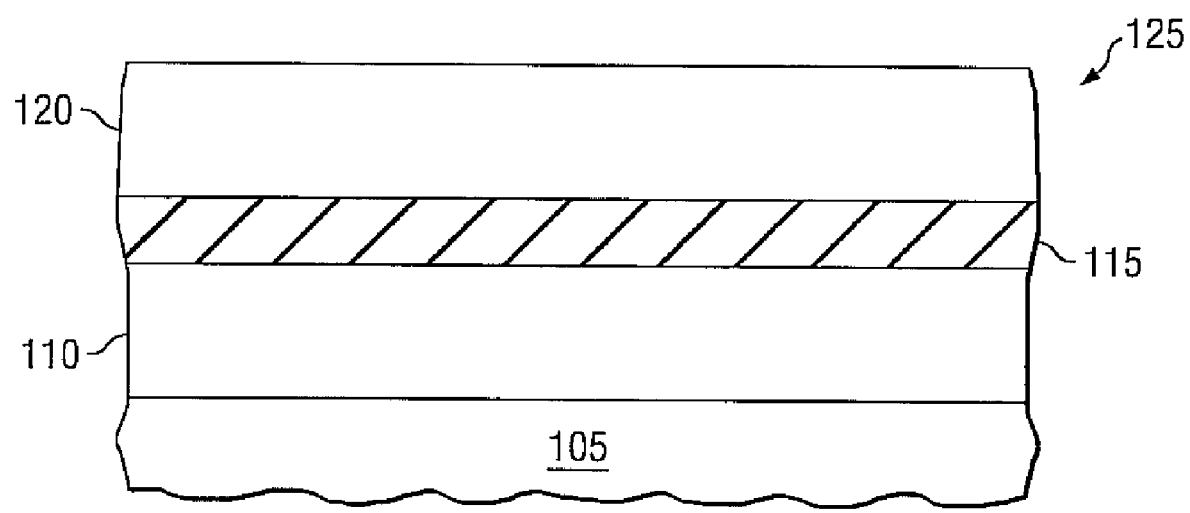

Referring to FIG. 1E, the capacitor 125 may be annealed to activate the implanted dopants in the first and second layers of polysilicon, 110, 120, respectively. The range of temperatures for the annealing can range from about 800 to 1000 degrees Celsius.

As a processing note, the selection of the dopant concentration for the second layer of polysilicon 120 can also be dependent on the concentration of dopant for the first layer of polysilicon 110. More particularly, the amount of dopant for the second layer of polysilicon can be equivalent to the concentration of dopants in the first layer of polysilicon 110 such that the first and second layers of polysilicon have equivalent concentrations of dopants. The high implant doses and the equivalent doping provide for a high degree of voltage linearity performance over a voltage range comparable to or better than the metal capacitors which are described with respect to FIGS. 2, 3B.

Figure 2:
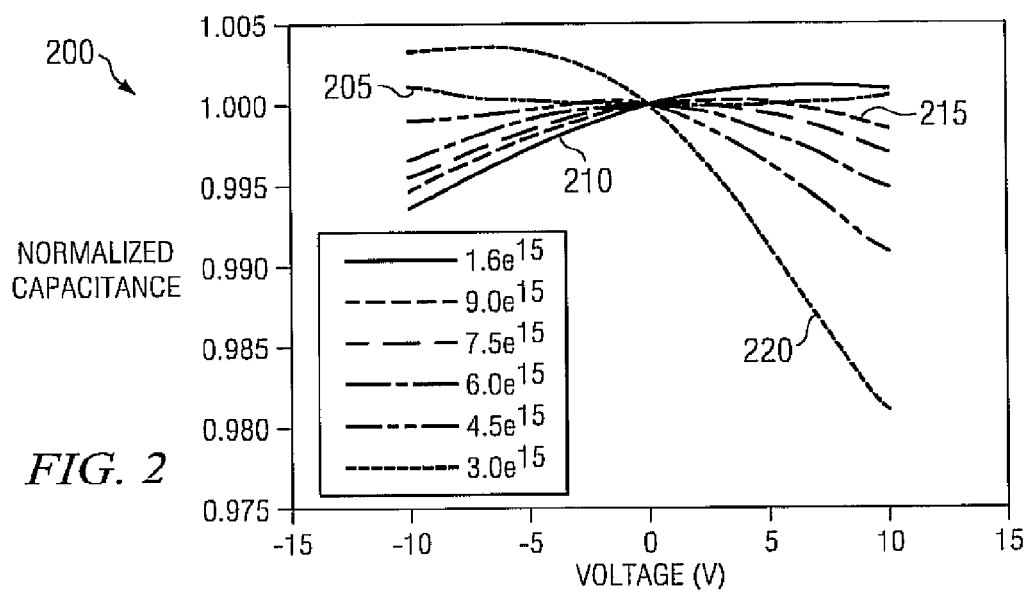
FIG. 2 depicts a graph comparing voltage linearity of metal capacitors and embodiments of the present teachings.

FIG. 2 illustrates a graph of the voltage linearity of various polysilicon capacitors with the top plate doped at various concentrations compared to a conventional metal capacitor. FIG. 2 is premised on several factors. One factor is that the thickness of the dielectrics for polysilicon capacitors (210-220) is 325 Angstroms and the metal capacitor is 350 angstroms. The implant dose for the bottom plate of the polysilicon capacitors is $7.9\times10^{15}$ atm/cm$^2$ as another factor. Yet another premise is that the metal capacitor is formed with two TiN electrodes, which shows the lowest dispersion over the voltage range.

As shown in FIG. 2, the voltage linearity graph of the metal capacitor 205 shows a relatively flat curve between −10 V and 10 V. The voltage linearity graph of a first capacitor 210 (doped at $1.6\times10^{16}$ atm/cm$^2$ for the top plate) shows a variation of substantially 0.00005 from the voltage linearity graph of the metal capacitor 205 for the normalized capacitance over the voltage range −10 V to 10 V. Similarly, the voltage linearity graph for a second capacitor 215 (doped at $9\times10^{15}$ atm/cm$^2$ for the top plate) shows a variation of substantially 0.0025 from the voltage linearity graph of the metal graph of the metal capacitor 205 for the normalized capacitance over the voltage range −10 V to 10V. For the third polysilicon capacitor 220 (doped at $3\times10^{15}$ atm/cm$^2$ for the top plate), the variation from the metal capacitor 205 is greater (on the order of 0.02) than the first and second polysilicon capacitors 210, 215, respectively. However, the third polysilicon capacitor 220 can be acceptable depending on the performance requirements of the device. Thus, one aspect of the voltage linearity of the various devices in FIG. 2 is that it tends to show that the higher doses of dopant generally improve the voltage linearity characteristics of the polysilicon capacitors. Another aspect that is shown in FIG. 2 is the ability to "tune" or design the voltage linearity of the particular capacitor based on the implant does. For example, if the performance requirement(s) of the capacitor is to operate between zero and five volts, a fabricator could select about $9\times10^{15}$ atm/cm$^2$ or $7.5\times10^{15}$ atm/cm$^2$ for the implant dose.

One observation of embodiments of the polysilicon capacitors is that the dopants in the polysilicon layers diffuse equally throughout their respective polysilicon layers. As a result, a polysilicon capacitor having a bottom plate thickness of 2700 Angstroms and dopant concentration of $7.9\times10^{15}$ atm/cm$^2$ can have an equivalent concentration as a top plate thickness of 2000 angstroms and dopant concentration of $6.0\times10^{15}$ atm/cm$^2$. Moreover, it is further noted that by maintaining the ratio of 7.9 to 6 for the bottom plate to top plate for increasing dopant concentrations, the voltage linearity of the polysilicon capacitors can be improved as shown in FIGS. 3A-B.

Figure 3A:
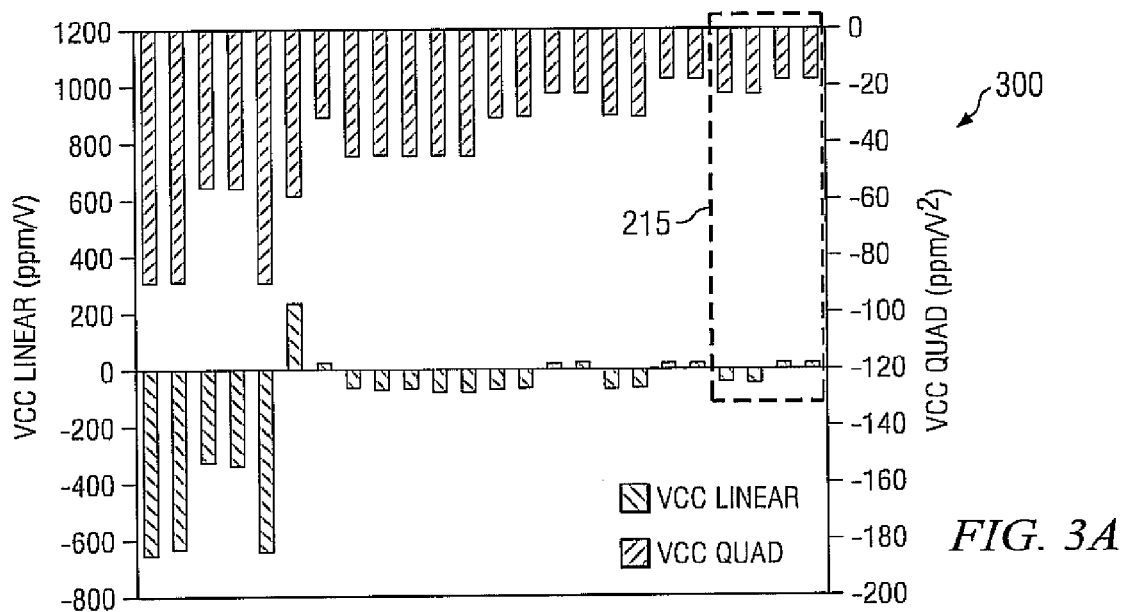
FIG. 3AB collectively depict the voltage linearity of an embodiment of the present teachings.

FIG. 3A shows a plot 300 of VCC linear and VCC quad terms for various concentrations at the 7.9 to 6 ratio. The concentration of the dopant for the top electrode ranges from 3e15 to 9e15 Atms/cm$^2$ from the left side to the right side. The VCC linear and VCC quad terms are coefficients for the curves representing the polysilicon capacitors shown in FIG. 2.

As noted by the bottom bar 305 of the plot 300, the VCC linear and VCC quad terms generally show that the these terms are decreasing in value as the equivalent dopant concentrations in both top and bottom plates of the polysilicon are increased. The last value of the bottom bar 305 in box 310 represents the highest equivalent concentration having a VCC linear value of 21.32 and a VCC quad value of −17.23. Since the coefficients are generally small and are in opposite sign, this indicates that the last value is relatively flat over a given voltage range. A plot of the VCC for the last concentration is shown in FIG. 3B. This particular capacitor was configured to have a dopant concentration of $1.2 \times 10^{16}$ cm$^{-2}$ in the bottom electrode and $9 \times 10^{15}$ cm$^{-2}$ in the top electrode. Both electrodes were also implemented with amorphous silicon.

Figure 3B:
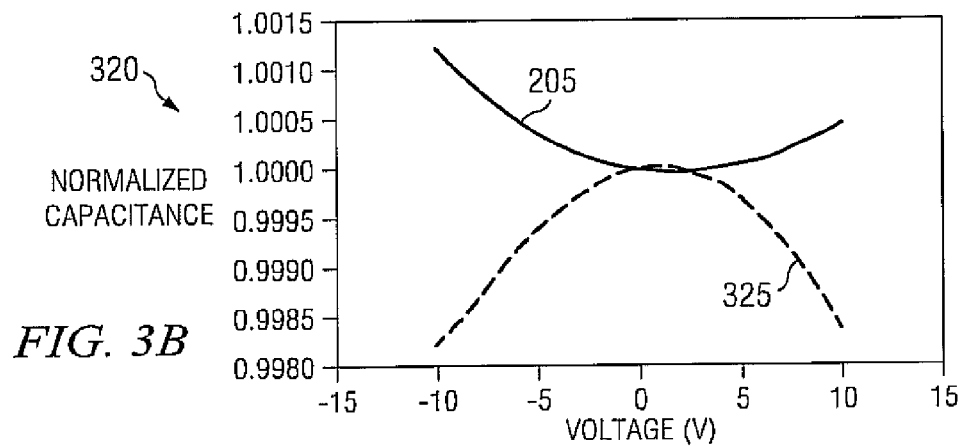

FIG. 3B is a normalized capacitance versus voltage range graph 320 for the same metal capacitor 205 shown in FIG. 2 and a polysilicon capacitor 325 having VCC linear value of 21.32 and a VCC quad value of −17.23 (shown in FIG. 3A). As shown in FIG. 3B, the variation of the polysilicon capacitor 325 is substantially on the order of 0.0015 from −10V to 10 V, which can be comparable to the metal capacitor 205 over the same range. Accordingly, high implant doses along with the implant doses being equivalent for the top and bottom plate of the polysilicon capacitor provide for VCC characteristics comparable to or better than metal capacitors.

It is to be understood that the terms "top", "bottom", "side", "upper", "lower", "front", "rear", "horizontal", "vertical" and the like are used herein merely to describe points of reference and do not limit the present invention to any specific configuration or orientation.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

While the invention has been described with reference to the exemplary embodiments thereof, those skilled in the art will be able to make various modifications to the described embodiments without departing from the true spirit and scope. The terms and descriptions used herein are set forth by way of illustration only and are not meant as limitations. In particular, although the method has been described by examples, the steps of the method may be performed in a different order than illustrated or performed simultaneously. Those skilled in the art will recognize that these and other variations are possible within the spirit and scope as defined in the following claims and their equivalents.

What is claimed is:

1. A method of forming a capacitor, the method comprising:
    depositing a first layer of polysilicon on a substrate;
    implanting a high dose of dopant into the first layer of polysilicon;
    depositing a layer of dielectric over the first layer of polysilicon;
    depositing a second layer of polysilicon over the layer of dielectric, and
    implanting an equivalent concentration of dopant as the first layer of polysilicon into the second layer of polysilicon.

2. The method of claim 1 further comprising annealing the capacitor.

3. The method of claim 2, wherein the annealing is done in a temperature range of between about 800 and about 1000 Celsius.

4. The method of claim 1, wherein the first layer of polysilicon has a thickness of between about 2000 to 2700 Angstroms, inclusively.

5. The method of claim 1, wherein the layer of dielectric has a thickness of substantially 350 Angstroms.

6. The method of claim 5, wherein the layer of dielectric comprises SiN.

7. A capacitor comprising:
    a first layer of polysilicon deposited over a substrate;
    a dielectric layer deposited over the first layer of polysilicon; and
    a second layer of polysilicon deposited over the dielectric layer, wherein the first layer of polysilicon and the second layer of polysilicon are implanted with dopant in substantially equivalent concentrations.

8. The capacitor of claim 7, wherein a depth of the first layer of polysilicon is not equivalent to the depth of the second layer of polysilicon.

9. The capacitor of claim 8, wherein the first layer of polysilicon has a thickness in the range of 2000 to 2700 Angstroms, inclusively.

10. The capacitor of claim 7, wherein the layer of dielectric has a thickness of about 350 Angstroms.

11. The capacitor of claim 9, wherein the layer of dielectric comprises one of SiN, $SiO_2$, $Al_2O_3$, $Ta_2O_5$, $HfO_2$, HfSiON.

12. A method for forming an integrated circuit in and on a silicon substrate with a polysilicon capacitor, the method comprising:
    depositing a first layer of polysilicon on a substrate;
    implanting a high dose of implant into the first layer of polysilicon;
    depositing a layer of dielectric over the first polysilicon;
    depositing a second layer of polysilicon over the layer of dielectric, and
    implanting an equivalent concentration of implant as the first layer of polysilicon into the second layer of polysilicon.

13. The method of claim 12 further comprising annealing the polysilicon capacitor.

14. The method of claim 12, wherein the annealing the polysilicon capacitor is at a temperature between about 800 and about 1000 Celsius.

15. The method of claim 12, wherein the first layer of polysilicon has a thickness of between about 2000 and about 2700 Angstroms, inclusively.

16. The method of claim 12, wherein the layer of dielectric has a thickness of about 350 Angstroms.

17. The method of claim 16, wherein the layer of dielectric comprises is one of SiN, $SiO_2$, $Al_2O_3$, $Ta_2O_5$, $HfO_2$, HfSiON.

18. The method of claim 1, wherein the layer of dielectric comprises one of SiN, $Al_2O_3$, $Ta_2O_5$, $HfO_2$, HfSiON.

19. The capacitor of claim 7, wherein the layer of dielectric comprises one of SiN, $Al_2O_3$, $Ta_2O_5$, $HfO_2$, HfSiON.

20. The method of claim 12, wherein the layer of dielectric comprises one of SiN, $Al_2O_3$, $Ta_2O_5$, $HfO_2$, HfSiON.

* * * * *